United States Patent [19]
Kozono

[11] Patent Number: 5,497,031
[45] Date of Patent: Mar. 5, 1996

[54] SEMICONDUCTOR DEVICE HAVING SEMICONDUCTOR CHIP WITH BACKSIDE ELECTRODE

[75] Inventor: Hiroyuki Kozono, Oomiya, Japan

[73] Assignee: Kabushiki Kaisha Toshiba, Kawasaki, Japan

[21] Appl. No.: 310,303

[22] Filed: Sep. 22, 1994

[30] Foreign Application Priority Data

Sep. 24, 1993 [JP] Japan .................................. 5-238144

[51] Int. Cl.$^6$ .......................... H01L 23/053; H01L 23/12
[52] U.S. Cl. .......................... 257/700; 257/693; 257/698; 257/784
[58] Field of Search ................................... 257/686, 693, 257/700, 698, 791, 794, 776, 784

[56] References Cited

U.S. PATENT DOCUMENTS

| | | | |
|---|---|---|---|
| 4,513,355 | 4/1985 | Schroeder et al. | 361/403 |
| 4,972,253 | 11/1990 | Palino et al. | 257/693 |
| 5,008,734 | 4/1991 | Dutta et al. | 257/693 |
| 5,041,899 | 8/1991 | Oku et al. | 257/693 |
| 5,043,794 | 8/1991 | Tai et al. | 257/686 |
| 5,173,767 | 12/1992 | Lange et al. | 257/700 |
| 5,235,209 | 8/1993 | Shimizu et al. | 257/693 |
| 5,331,511 | 7/1994 | Lee et al. | 257/700 |

FOREIGN PATENT DOCUMENTS 0416726  3/1991  European Pat. Off. .

OTHER PUBLICATIONS

"Electrical Design Methodology of a 407 Pin Multi Layer Ceramic Package", 39th IEEE/ECC, May 22–24, 1989, Houston, Texas, pp. 392–397.
"GaAs Multichip Module for a Parallel Processing System", 40th IEEE/ECTC, 1990, Las Vegas, Nevada, pp. 580–585.
Cicone 'Silicon Integrated High Performance Package' IBM, vol. 27 No. 7B Dec. 1984 p. 4226.

Primary Examiner—Rolf Hille
Assistant Examiner—David Ostrowski
Attorney, Agent, or Firm—Finnegan, Henderson, Farabow, Garrett & Dunner

[57] ABSTRACT

A semiconductor chip is mounted on a chip-mounting section. A conduction path forming section having a plurality of conduction paths formed therein is placed around the chip-mounting section. A heat sinking board is bonded to the backsides of the chip-mounting section and the conduction path forming section. In the conduction path forming section, a second insulating layer is formed with notches, whereby the exposed area of conduction paths that are wire-bonded to the chip-mounting section is increased.

11 Claims, 6 Drawing Sheets

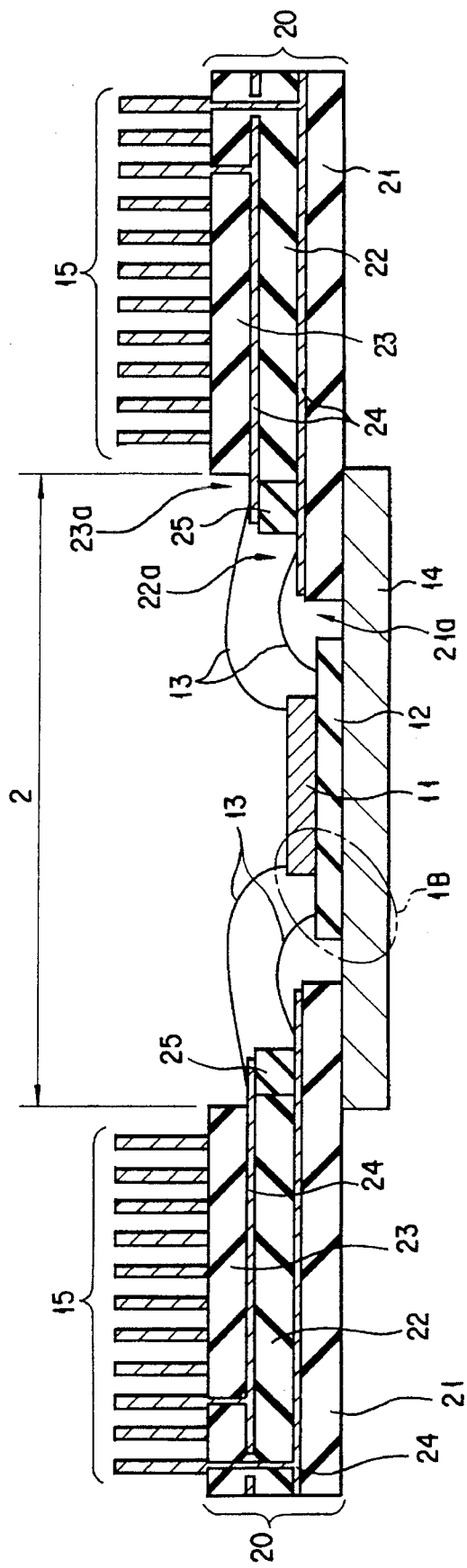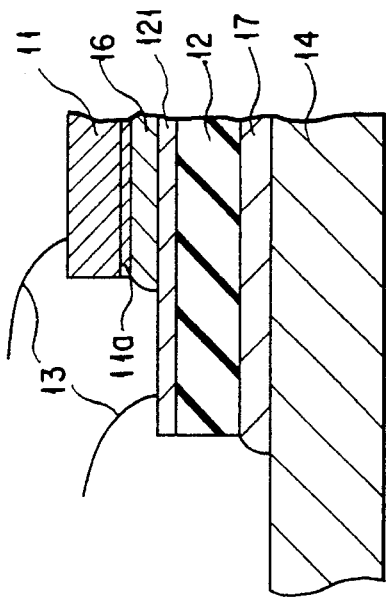
FIG. 1A
FIG. 1B

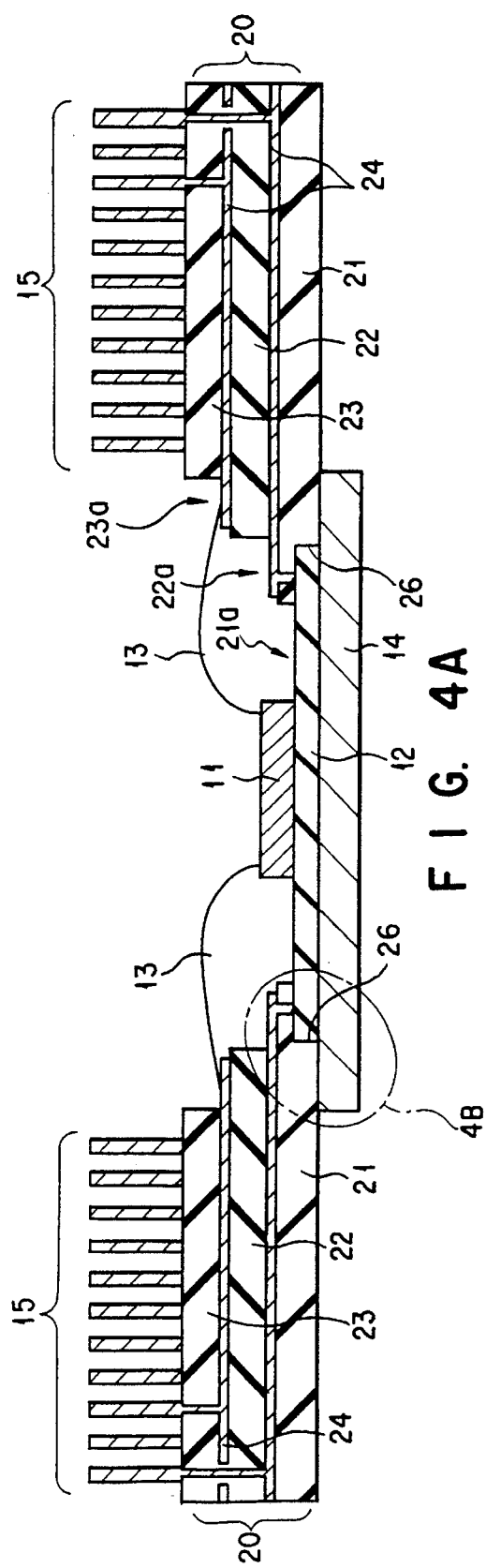
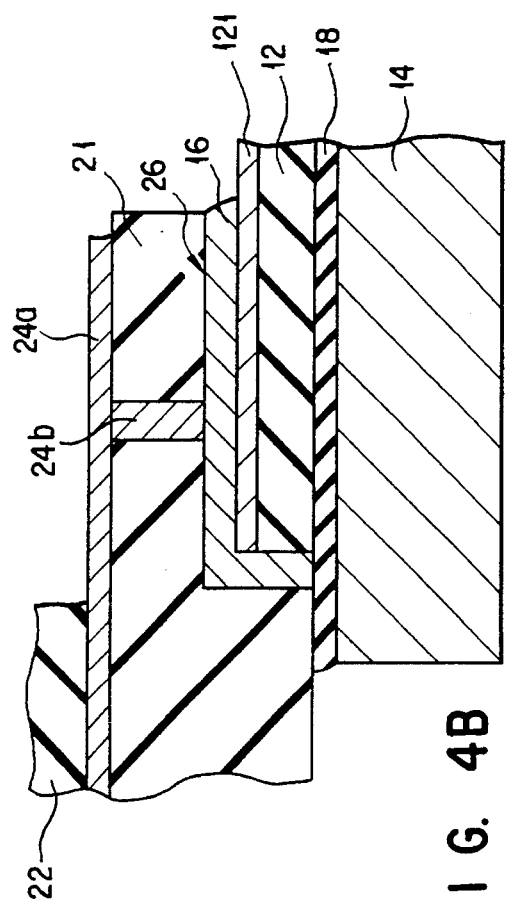
FIG. 4A
FIG. 4B 5,497,031

SEMICONDUCTOR DEVICE HAVING SEMICONDUCTOR CHIP WITH BACKSIDE ELECTRODE

BACKGROUND OF THE INVENTION

1. Field of the Invention

The present invention relates to a semiconductor device and more particularly to a semiconductor device in which an electrode is drawn out of the backside of an on-board semiconductor chip.

2. Description of the Related Art

As a form of package used for semiconductor integrated circuits there is a PGA (pin grid array). The PGA is arranged such that external terminals or pins are fixed to a package body at regular intervals vertically and in the form of grid. The PGA is often used as a multi-terminal package.

Semiconductor devices used in high frequency bands each have an electrode formed on the entire backside of their respective semiconductor chip in order to stabilize their operating characteristics. Hereinafter, such an electrode is referred to as a backside electrode.

FIG. 6 shows a conventional semiconductor device having a PGA structure. In FIG. 6, the semiconductor device comprises a semiconductor chip 101, a chip-mounting section 102, a conducting path forming section 110, a plurality of bonding wires 103, a heat sinking board 104, and a plurality of pin-like external terminals 112. The semiconductor chip 101 has an electrode formed on its backside. The semiconductor chip 101 is mounted on the chip-mounting section 102. The conducting path forming section is disposed around the edges of the chip-mounting section 102 and have a plurality of conducting paths 111 formed inside. The bonding wires 103 connect pad electrodes (not shown) formed on the semiconductor chip 101 and the chip-mounting section 102 to corresponding respective ones of the conduction paths 111. The heat sink 104 is bonded to the backside of each of the chip-mounting section 102 and the conductive-path forming section 110. The chip-mounting section 102 is made of an insulating material and coated on top with a conductive film not shown. The external terminals 112 are provided on the top of the conducting path forming section 110 and electrically connected to the respective ones of the conduction paths 111.

FIG. 7 is an enlarged view of the semiconductor chip 101, the chip-mounting section 102, and the conduction path forming section 110. In this FIGURE, the conduction paths 111 are provided radially on first and second insulating layers 113 and 114. Each of pad electrodes 115 on the semiconductor chip 101 is connected to a respective one of the conduction paths 111 by a bonding wire 103. The backside electrode of the semiconductor chip 101 is electrically connected to the conductive film 102a on the top of the chip-mounting section 102, which, in turn, is connected to a conduction path 111a on the first insulating layer 113 by bonding wires 103.

It is thus required that the conductive film 102a on the chip-mounting section 102 be wire-bonded to the conduction path 111a when the semiconductor chip 101 is coated underneath with an electrode. In this case, as shown in FIG. 7, this wire bonding is performed at corners of the chip-mounting section 102 and the conduction path forming section 110, which offers little obstruction to wire bonding of the pad electrodes on the chip and allows the bonding area to be increased.

The reliability of semiconductor devices is significantly affected by wire bonding. Thus, good bonding must be effected at all connection points. In general, however, there is a tendency that, when a wire used is short, the resulting wire loop becomes low in height and, when a wire used is too long, it comes loose to form an underloop. In other words, the bonding wires must lie within an appropriate range of length. When a wire is short, it is liable to peel off the point where it has been bonded. When a wire is too long, on the other hand, it may come in contact with another portion. For this reason, the length of the bonding wires between the conductive film 102a on the chip-mounting section 102 and the conduction path 111a must be set appropriately.

The wire bonding is performed by the use of a capillary and hence there is a need for a space where it can move. In wire bonding for the semiconductor chip 101 and the conduction path 111a in particular, the space where the capillary moves must be fully taken into consideration because the semiconductor chip 101 or the second insulating layer 114 of the conduction path forming section 110 forms a difference in level within the space for movement of the capillary. That is, assuming the shortest distance between a point of bonding on the conductive film 102a and the corner of the semiconductor chip to be L1 and the shortest distance between a point of bonding on the conduction path 111a and the corner of the second insulating layer 114 to be L2, these distances L1 and L2 must be set to the shortest distance required for bonding over which the capillary can move. Thus, the size W of the cavity shown in FIG. 6, or the inside diameter of the conductive path forming section 110, is defined by the size of the semiconductor chip 101 and the space needed for wire bonding at the corners.

FIG. 8 shows cavity size versus semiconductor chip size. When no wire bonding is performed on the chip-mounting section 102 and the conduction path forming section 110, the semiconductor chip size is allowed to lie in the range defined by lines A1 and A2. When wire bonding is performed, on the other hand, the chip size must lie within the range defined by lines A1 and A3. To be specific, assume that the cavity size is 10 mm. If, in this case, no wire bonding is performed, the semiconductor chip size can range from 4.0 to 7.0 mm. When wire bonding is performed, the chip size must range from 4.0 to 5.0 mm. That is, when the chip-mounting section 102 and the conduction path forming section 110 need to be connected with each other by wire bonding, the chip size is restricted within narrow limits, decreasing the versatility of the conduction path forming section (cavity) 110 or the semiconductor chip 101.

As described above, since the chip-mounting section 102 and the conduction path forming section 110 are wire bonded so as to connect the backside electrode of the semiconductor chip and the conduction path forming section 110 with each other, a space must be reserved for wire bonding. This restricts the size of a semiconductor chip.

SUMMARY OF THE INVENTION

It is an object of the present invention to provide a PGA-structured semiconductor device which has an on-board semiconductor chip with a backside electrode and permits the size of the semiconductor chip to be increased.

According to a first aspect of the present invention, there is provided a semiconductor device comprising:

a semiconductor chip having a plurality of pad electrodes on its top and a backside electrode on its backside;

a chip-mounting section on which the semiconductor chip is mounted, the chip-mounting section having a conductive layer on its top which is in contact with the backside electrode of the semiconductor chip;

a conduction path forming section disposed around the chip-mounting section, the conduction path forming section including first, second and third insulating layers, the second insulating layer being located over the first insulating layer, the third insulating layer being located over the second insulating layer, the first, second and third insulating layers having their respective openings which increase in diameter in the order of the first, second and third insulating layers, the semiconductor chip being placed in the opening of the first insulating layer; a plurality of external terminals arranged on the third insulating layer; a first group of conduction paths formed on the first insulating layers and having their one ends exposed in the opening of the second insulating layer and their other ends connected to the external terminals; and a second group of conduction paths formed on the second insulating layer and having their one ends exposed in the opening of the third insulating layer and their other ends connected to the external terminals;

a first group of bonding wires for electrically connecting the one ends of the first group of conduction paths with the conductive layer of the chip-mounting section;

a second group of bonding wires for electrically connecting the one ends of the second group of conduction paths with the pad electrodes of the semiconductor chip; and a heat sinking board bonded to the backside of the chip-mounting section and part of the backside of the conduction path forming section, the second insulating layer having notches which are cut in the opposite direction to the semiconductor chip, and the exposed area of the first group of conduction paths being set larger than that of the second group of conduction paths.

According to a second aspect of the present invention, there is provided a semiconductor device comprising:

a semiconductor chip having a plurality of pad electrodes on its top and a backside electrode on its backside;

a conduction path forming section disposed around the semiconductor chip, the conduction path forming section including first, second and third insulating layers, the second insulating layer being located over the first insulating layer, the third insulating layer being located over the second insulating layer, the first, second and third insulating layers having their respective openings which increase in diameter in the order of the first, second and third insulating layers, the semiconductor chip being placed in the opening of the first insulating layer; a plurality of external terminals arranged on the third insulating layer; a first group of conduction paths formed on the first insulating layers and having their one ends exposed in the opening of the second insulating layer and their other ends connected to the external terminals; a second group of conduction paths formed on the second insulating layer and having their one ends exposed in the opening of the third insulating layer and their other ends connected to the external terminals; and a conductor formed in the first insulating layer and having its one end connected to the first group of conduction paths and its other end exposed on the backside of the first insulating layer;

a chip-mounting section provided on the backside of the first insulating layer and coated on top with a conduction layer on which the semiconductor chip is mounted, the backside electrode of the semiconductor chip and the other end of the conductor in the first insulating layer being connected together by the conduction layer;

bonding wires for electrically connecting the one ends of the second group of conduction paths with the pad electrodes of the semiconductor chip; and a heat sinking board bonded to backsides of the chip-mounting section and the first insulating layer.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a diagrammatic sectional view of a semiconductor device according to a first embodiment of the present invention;

FIG. 1B is an enlarged view of a portion indicated by circle 1B in FIG. 1A;

FIG. 4A diagrammatic sectional view of a semiconductor device according to a second embodiment of the present invention;

FIG. 4B is an enlarged view of a portion indicated by circle 4B in FIG. 4A;

DETAILED DESCRIPTION OF THE PREFERRED EMBODIMENTS

Figure 2:
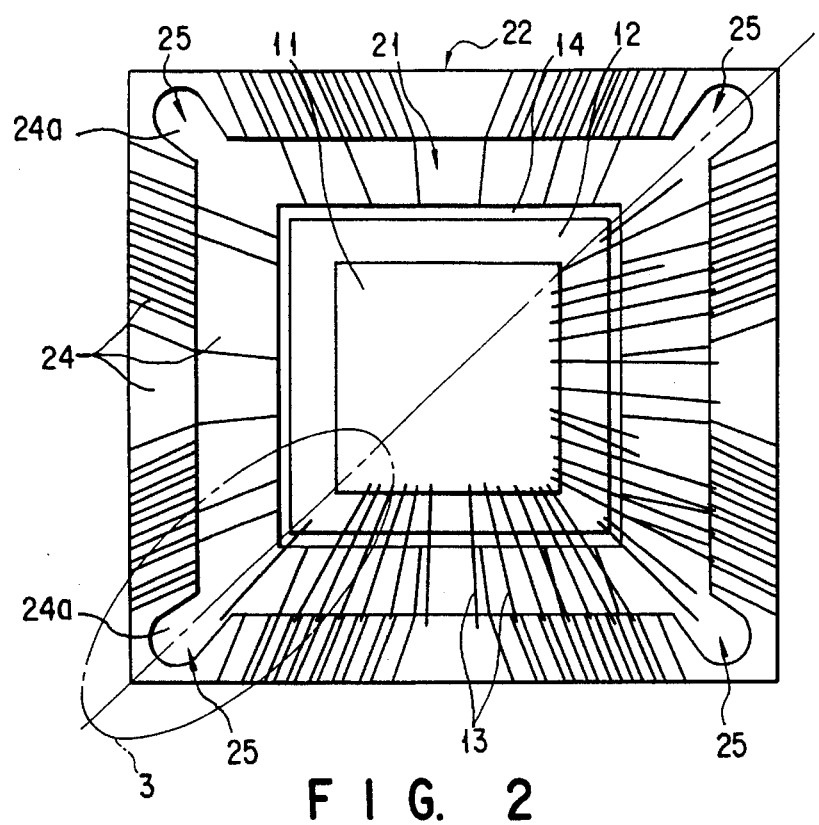
FIG. 2 is a plan view of a portion corresponding to line 2 in FIG. 1A.

FIGS. 1A and 1B show a semiconductor device according to a first embodiment of the present invention. The semiconductor device comprises a semiconductor chip 11, a chip-mounting section 12, a conduction path forming section 20, bonding wires 13, a heat sinking board 14, and pin-like external terminals 15. The semiconductor chip 11 is mounted on the chip-mounting section 12. The conduction path forming section 20 is disposed around the chip-mounting section 12 and has a plurality of conduction paths 24 formed inside. The bonding wires 13 electrically connect pad electrodes (not shown) on the semiconductor chip 11 and the chip-mounting section 12 with the conduction paths 24. The heat sink 14 is bonded to the backsides of the chip-mounting section 12 and the conduction path forming section 20. The external terminals 15 are provided on the top of the conduction path forming section 20.

The conduction path forming section 20 comprises a first insulating layer 21, a second insulating layer 22, a third insulating layer 23, and conduction paths 24 interposed between every insulating layer. The first, second and third insulating layers 21, 22 and 23 respectively have square openings 21a, 22a and 23a each having a different diameter. Of these openings, the uppermost opening 23a is the greatest in diameter, followed by the opening 22a. Thus, the insulating layers 21, 22 and 23 form steps at their central portion. The second insulating layer 22 has notches 25 formed at the four corners of the square opening 22a. The notches will be described later in detail. Each of the conduction paths has its end exposed at the opening and its other end electrically connected to a corresponding one of the external terminals 15.

FIG. 1B is an enlarged view of a portion indicated by circle 1B in FIG. 1A. The semiconductor chip 11 has a backside electrode 11a produced by metal evaporation onto its backside. The chip-mounting section 12 consists of a highly insulating material and is coated on top with a metal layer 121. The backside of the semiconductor chip 11 is bonded to the metal layer 121 by a conductive adhesive 16. The heat sink 14 is bonded to the backside of the chip-mounting section 12 by an adhesive 17. This adhesive 17 may be either insulating or conducting. The heat sink 14 is also bonded to the backside of the conduction path forming section 20 by the adhesive 17.

FIG. 2 is a plan view of a portion corresponding to line 2 in FIG. 1A with bonding wires 13 omitted on the left side of a diagonal dashed-and-dotted line. As can be seen from this figure, the conduction paths 24 extend radially on the first and second insulating layers 21 and 22. The second insulating layer 22 is formed at its respective corners with notches 25. Each notch is formed in the opposite direction to a corresponding one of the corners of the semiconductor chip 11.

Figure 3:
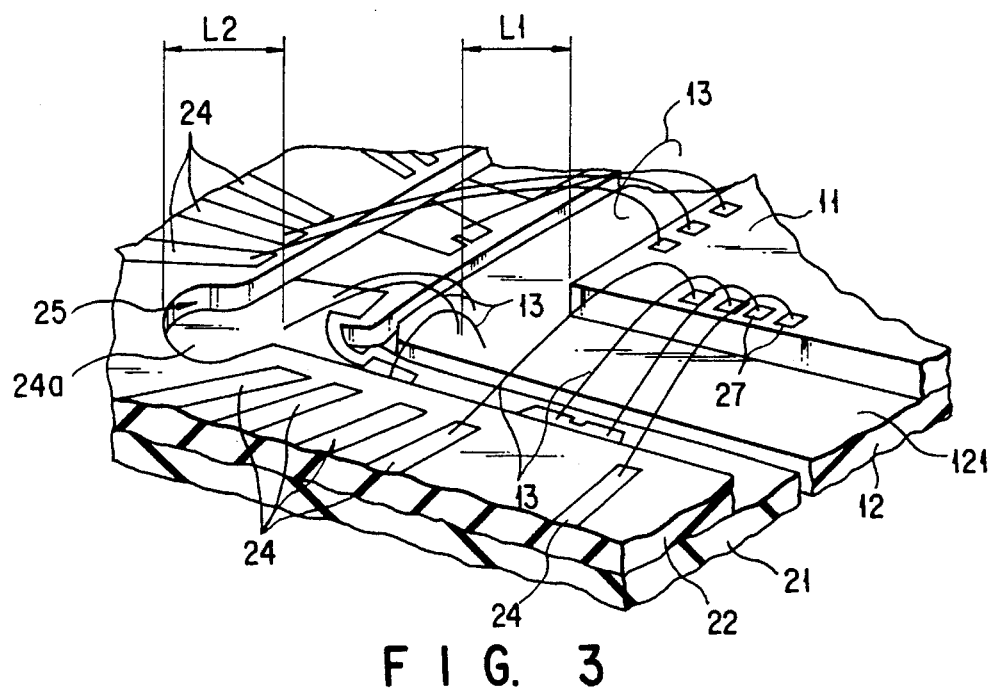
FIG. 3 is an enlarged perspective view of a portion indicated by circle 3 in FIG. 2.

The notches 25 will be further described with reference to FIG. 3. The notches 25 are formed at the corners of the second insulating layer 22. Each notch increases the exposed area of the conduction path 24a formed on the first insulating layer 21. One of the bonding wires 13 has its one end bonded to the metal layer 121 and its other end bonded to that portion of the conduction path 24a which is exposed by the notch 25. This permits the bonding wire 13 to be set to an appropriate length. Moreover, the point of bonding on the chip-mounting section 12 can be put away from the semiconductor chip 11, permitting the distance L1 to be set long. Thus, the metal layer 121 and the conduction path 24a can be readily connected to each other by wires. In addition, the distance L2 can also be set long, which permits a sufficient space to be reserved for movement of the capillary. Furthermore, since the notches 25 are formed at the corners of the second insulating layer 22, the pad electrodes 27 on the semiconductor chip 11 and the conduction paths 24 on the second insulating layer 22 can be connected together by bonding wires 13 in the same manner as the prior art.

Here, L1 is the shortest distance between the point of bonding on the chip-mounting section 12 and the semiconductor chip 11, and L2 is the distance between the point of bonding on the conduction path 24a and the intersection of a straight line along the bonding wire and the second insulating layer 22, i.e., the distance between the point of bonding on the conduction path 24a and the deepest point in the notch 25.

According to the first embodiment of the present invention, the notches 25 are provided at the corners of the square opening 22 in the second insulating layer 22 to thereby increase the exposed area of the conduction path 24a that is wire-bonded to the chip-mounting section 12. Thus, the space for movement of the capillary can be increased, thereby permitting easy bonding. In addition, the bonding wires can be set to an appropriate length, which prevents the wires from peeling off.

Since the exposed area of the conduction path 24a is increased, the points of bonding on the chip-mounting section 12 can be put away from the semiconductor chip even if the length of the bonding wires is set appropriately. For this reason, increasing the semiconductor chip size is allowed.

In the first embodiment, the notches 25 are provided at the corners of the second insulating layer 22. This is not restrictive. The notches may be provided at other portions of the second insulating layer than its corners if they are located over the conduction paths 24a. In other words, the conduction paths 24a can be located in any position on the first insulating layer 21 where they do not come into contact with other bonding wires, and the notches 25 can be formed on such conduction paths.

Next, reference will be made to FIGS. 4A and 4B to describe a second embodiment of the present invention. In FIGS. 4A and 4B, like reference numerals are used to denote corresponding portions to those in the first embodiment, and only different portions will be described below.

In FIG. 4A, the semiconductor chip 11 is mounted on the chip-mounting section 12 by means of a conductive adhesive (not shown). The first insulating layer 21 is undercut along its opening 21a to form an undercut portion 26. The periphery of the chip-mounting section 12 is fit into the undercut 26 of the insulating layer 21. The backsides of the chip-mounting section 12 and the conduction path forming section 20 are bonded to the heat sink 14 by means of an insulating adhesive (not shown).

FIG. 4B is an enlarged view of a portion indicated by circle 4B in FIG. 4A. In FIG. 4B, the first insulating layer 21 is formed with a conduction path 24b which passes through that layer and is connected with the conduction path 24b on the first insulating layer 21. The metal layer 121 provided on the top of the chip-mounting section 12 and the conduction path 24b are electrically connected with each other by means of conductive adhesive 16. That is, the backside electrode of the semiconductor chip 11 is electrically connected to the conduction path 24a through the metal layer 121, conductive adhesive 16 and conduction path 24b without using wire bonding.

It is needless to say that the pad electrodes (not shown in FIGS. 4A and 4B) on the semiconductor chip 11 are connected by bonding wires to the conduction paths radially arranged on the first insulating layer 21 or second insulating layer 22.

Next, a third embodiment of the present invention will be described with reference to FIGS. 5A and 5B. Like reference numerals are used to denote corresponding parts to those in the second embodiment. The present embodiment uses an insulating heat sinking board 30, which serves as a chip-mounting section and a heat sink. A metal layer 121 is deposited onto the top of the insulating heat sinking board 30, and the semiconductor chip 11 is bonded to the metal layer 121 by a conductive adhesive not shown.

Figure 5A:
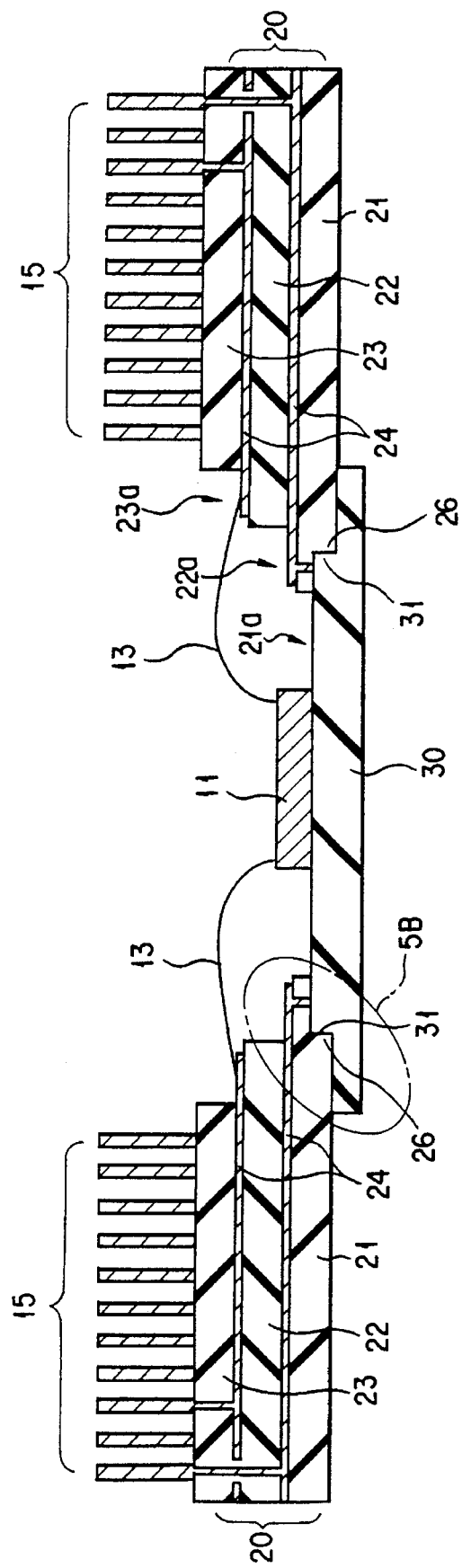
FIG. 5A is a diagrammatic sectional view of a semiconductor device according to a third embodiment of the present invention.
Figure 5B:
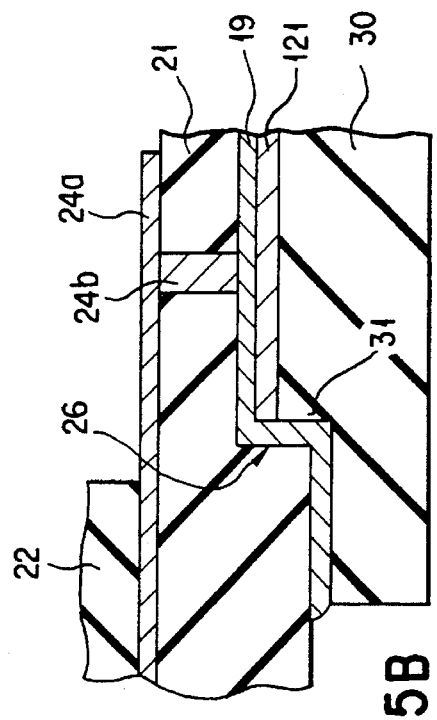
FIG. 5B is an enlarged view of a portion indicated by circle 5B in FIG. 5A.
Figure 6:
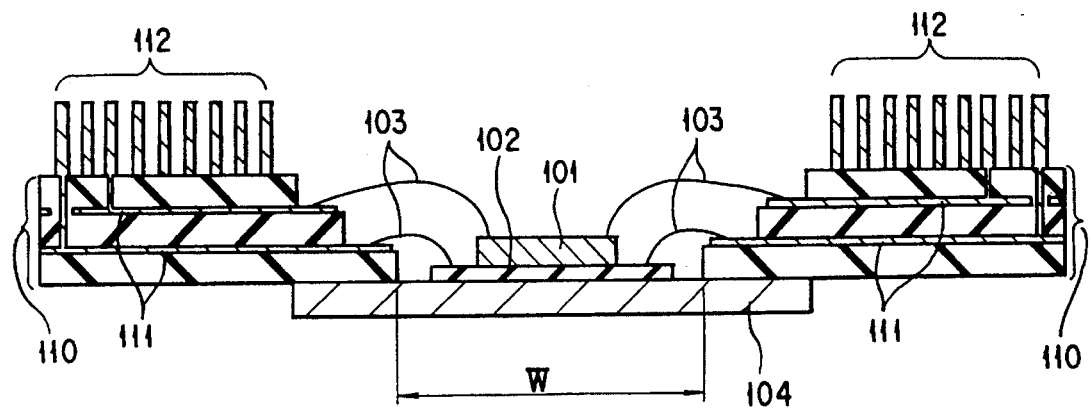
FIG. 6 is a diagrammatic sectional view of a conventional semiconductor device.
Figure 7:
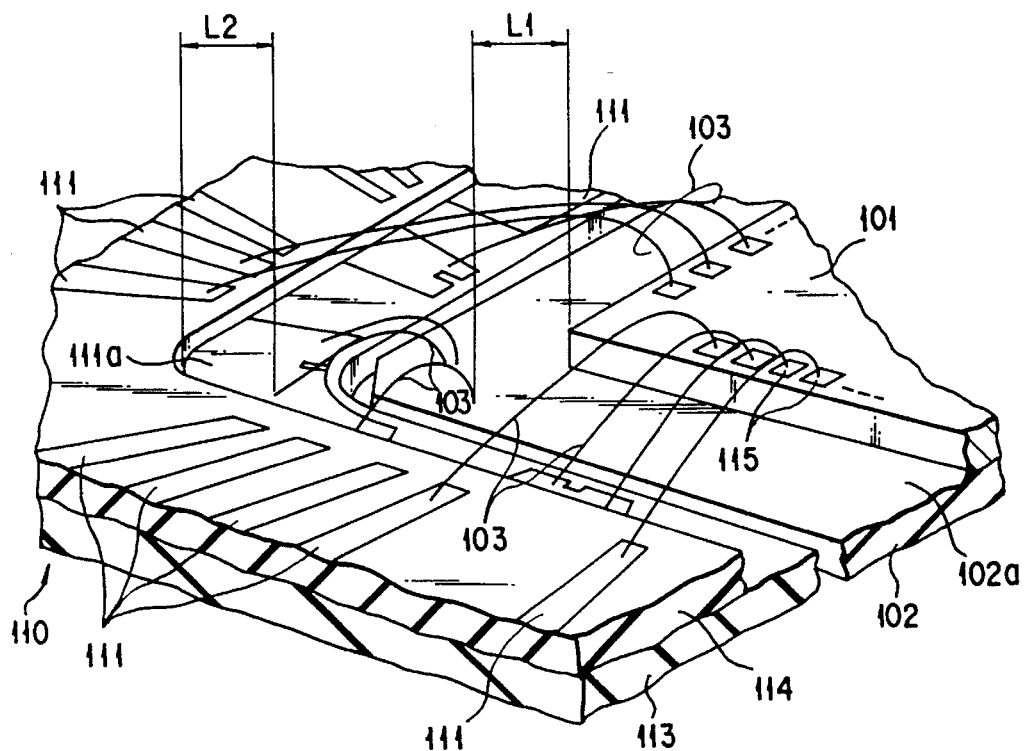
FIG. 7 is an enlarged sectional view of a portion of the semiconductor device of FIG. 6.
Figure 8:
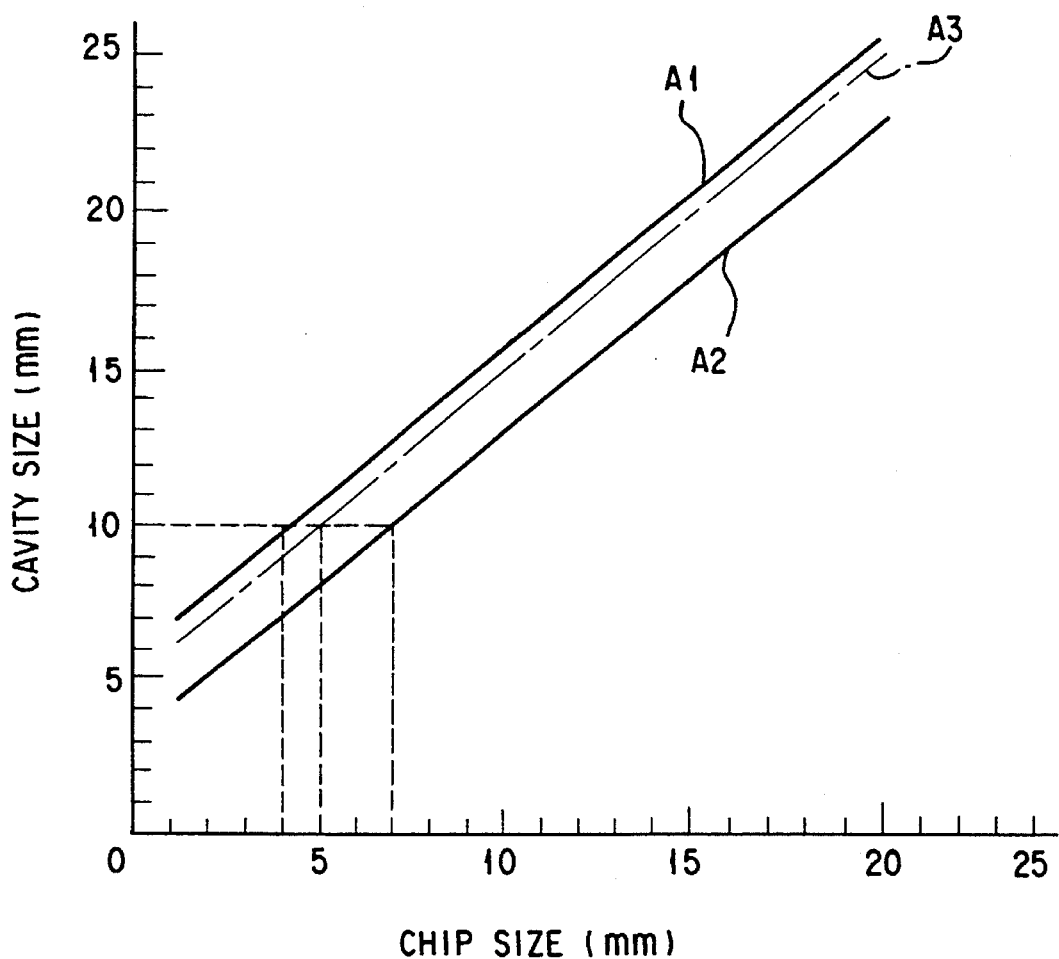
FIG. 8 is a graph illustrating a relationship between the semiconductor chip size and the cavity size.

FIG. 5B is an enlarged view of a portion indicated by circle 5B in FIG. 5A. The insulating heat sinking board 30 has a stepped portion 31 along its periphery. The stepped portion 31 of the heat sinking board 30 is fit into the undercut portion 26 of the first insulating layer 21 and they are bonded to each other by a conductive adhesive 19. The backside electrode (not shown) of the semiconductor chip 11 is electrically connected to the conduction path 24a through the conductive adhesive 16, metal layer 121, conductive adhesive 19 and conduction path 24b.

In the second embodiment, the conduction path forming section 20 and the chip-mounting section 12 are electrically connected together by the conductive adhesive 16, and, in the third embodiment, the conduction path forming section 20 and the insulating heat sinking board 30 are electrically connected together by the conductive adhesive 19. That is, the second and third embodiments eliminate the need for the metal layer 121 and the conduction path 24a to be wire-bonded together as in the first embodiment. Thus, there is no restriction on semiconductor chip size. Namely, the chip size can be increased. The use of a semiconductor chip about the size of a cavity is allowed. Also, the semiconductor chip size can be made substantially the same as when no electrode is drawn out of the backside of the chip.

What is claimed is:

1. A semiconductor device comprising:
   a semiconductor chip having a plurality of pad electrodes on its top and a backside electrode on its backside;
   a chip-mounting section on which said semiconductor chip is mounted, said chip-mounting section having a conductive layer on its top which is in contact with said backside electrode of said semiconductor chip;
   a conduction path forming section disposed around said chip-mounting section, said conduction path forming section including first, second and third insulating layers, said second insulating layer being located over said first insulating layer, said third insulating layer being located over said second insulating layer, said first, second and third insulating layers having their respective openings which increase in diameter in the order of said first, second and third insulating layers, said semiconductor chip being placed in said opening of said first insulating layer; a plurality of external terminals arranged on said third insulating layer; a first group of conduction paths formed on said first insulating layer and having their one ends exposed in said opening of said second insulating layer and their other ends connected to said external terminals; and a second group of conduction paths formed on said second insulating layer and having their one ends exposed in said opening of said third insulating layer and their other ends connected to said external terminals;
   a first group of bonding wires for electrically connecting said one ends of said first group of conduction paths with said conductive layer of said chip-mounting section;
   a second group of bonding wires for electrically connecting said one ends of said second group of conduction paths with said pad electrodes of said semiconductor chip; and
   a heat sinking board bonded to said backside of said chip-mounting section and part of the backside of said conduction path forming section,
   said second insulating layer having notches which are cut in the opposite direction to said semiconductor chip, and the exposed area of said first group of conduction paths being set larger than that of said second group of conduction paths.

2. A device according to claim 1, wherein each of said openings of said first, second and third insulating layers is square, and said notches are formed at corners of said opening of said second insulating layer.

3. A device according to claim 1, wherein said first group of bonding wires have their one ends bonded to those parts of said first group of conduction paths which are exposed in said notches and their other ends bonded to said conduction layer of said chip-mounting section.

4. A semiconductor device comprising:
   a semiconductor chip having a plurality of pad electrodes on its top and a backside electrode on its backside;
   a conduction path forming section disposed around said semiconductor chip, said conduction path forming section including first, second and third insulating layers, said second insulating layer being located over said first insulating layer, said third insulating layer being located over said second insulating layer, said first, second and third insulating layers having their respective openings which increase in diameter in the order of said first, second and third insulating layers, said semiconductor chip being placed in said opening of said first insulating layer; a plurality of external terminals arranged on said third insulating layer; a first group of conduction paths formed on said first insulating layers and having their one ends exposed in said opening of said second insulating layer and their other ends connected to said external terminals; a second group of conduction paths formed on said second insulating layer and having their one ends exposed in said opening of said third insulating layer and their other ends connected to said external terminals; and a conductor formed in said first insulating layer and having its one end connected to said first group of conduction paths and its other end exposed on the backside of said first insulating layer;
   a chip-mounting section provided on the backside of said first insulating layer and coated on top with a conduction layer on which said semiconductor chip is mounted, said backside electrode of said semiconductor chip and the other end of said conductor in said first insulating layer being connected together by said conduction layer;
   bonding wires for electrically connecting said one ends of said second group of conduction paths with said pad electrodes of said semiconductor chip; and
   a heat sinking board bonded to backsides of said chip-mounting section and said first insulating layer.

5. A device according to claim 4, wherein said first insulating layer has an undercut portion formed along its opening, and the other end of said conductor in said first insulating layer is exposed in said undercut portion.

6. A device according to claim 5, wherein the periphery of said chip-mounting section is fit into said undercut portion of said first insulating layer, and the other end of said conductor is in contact with said conduction layer of said chip-mounting section at said undercut portion.

7. A device according to claim 4, wherein said chip-mounting section and said heat sinking board have insulating and heat sinking properties and are formed integral with each other.

8. A semiconductor device comprising:
   a semiconductor chip having a plurality of pad electrodes on its top and a backside electrode on its backside;
   a conduction path forming section disposed around said semiconductor chip, said conduction path forming section including first, second and third insulating layers, said second insulating layer being located over said first insulating layer, said third insulating layer being located over said second insulating layer, said first, second and third insulating layers having their respective openings which increase in diameter in the order of said first, second and third insulating layers, said semiconductor chip being placed in said opening of said first insulating layer; a plurality of external terminals arranged on said third insulating layer; a first group of conduction paths formed on said first insulating layers and having their one ends exposed in said opening of said second insulating layer and their other ends connected to said external terminals; a second group of conduction paths formed on said second insulating layer and having their one ends exposed in said opening of said third insulating layer and their other ends connected to said external terminals; and a conductor formed in said first insulating layer and having its one end connected to said first group of conduction paths and its other end exposed on the backside of said first insulating layer;

bonding wires for electrically connecting said one ends of said second group of conduction paths with said pad electrodes of said semiconductor chip; and a heat sinking board bonded to said backside of said first insulating layer and having a conductive layer on its top, said semiconductor chip being mounted on said conductive layer and said conductive layer being in contact with said backside of said semiconductor chip and the other end of said conductor.

9. A device according to claim 8, wherein said heat sinking board is made of an insulating material.

10. A device according to claim 8, wherein said first insulating layer has an undercut portion formed along its opening, and the other end of said conductor is exposed in said undercut portion.

11. A device according to claim 10, wherein said heat sinking board has a stepped portion which is fit into said undercut portion of said first insulating layer.

\* \* \* \* \*